(12) United States Patent
Kojima

(10) Patent No.: US 7,157,837 B2
(45) Date of Patent: Jan. 2, 2007

(54) PIEZOELECTRIC ACTUATOR

(75) Inventor: Masatomo Kojima, Ichinomiya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 115 days.

(21) Appl. No.: 10/786,778

(22) Filed: Feb. 25, 2004

(65) Prior Publication Data
US 2004/0164651 A1    Aug. 26, 2004

(30) Foreign Application Priority Data
Feb. 25, 2003    (JP)    ............... 2003-047546

(51) Int. Cl.
*H01L 41/047* (2006.01)
*B41J 2/045* (2006.01)

(52) U.S. Cl. ............ 310/365; 310/366; 310/364; 348/68; 348/70; 348/71; 348/72

(58) Field of Classification Search ........ 310/364–366; 347/68, 70–71, 72
See application file for complete search history.

(56) References Cited

U.S. PATENT DOCUMENTS 5,402,159 A    3/1995    Takahashi et al.
6,536,880 B1 *    3/2003    Takagi ................ 347/72
6,575,565 B1    6/2003    Isono et al.
2002/0051042 A1    5/2002    Takagi et al.
2003/0076007 A1 *    4/2003    Murai .................. 310/324

FOREIGN PATENT DOCUMENTS

JP    2001-162796    6/2001

* cited by examiner

*Primary Examiner*—Darren Schuberg
*Assistant Examiner*—J. Aguirrechea
(74) *Attorney, Agent, or Firm*—Reed Smith LLP (57) ABSTRACT

A piezoelectric actuator including two or more piezoelectric layers each of which is formed of a piezoelectric material and which are stacked on each other; three or more electrode layers which are stacked alternately with the piezoelectric layers; and one or more active portions each of which includes respective portions of the piezoelectric layers that are sandwiched by the electrode layers in a direction of stacking of the piezoelectric layers. Each active portion is expanded and contracted when an electric voltage is applied to the electrode layers. The piezoelectric layers include one or more first piezoelectric layers each having a first thickness, and one or more second piezoelectric layers each having a second thickness greater than the first thickness.

15 Claims, 9 Drawing Sheets

COMPARATIVE EXAMPLE

PIEZOELECTRIC ACTUATOR

BACKGROUND OF THE INVENTION

1. Field of the Invention

The present invention relates to a sheet-type piezoelectric actuator that includes a plurality of piezoelectric layers stacked on each other.

2. Discussion of Related Art

There is known an on-demand-type ink jet printer head that employs the above-indicated piezoelectric actuator. The known printer head additionally employs a cavity unit having an ink chamber to which a portion of the piezoelectric actuator is opposed. When that portion of the piezoelectric actuator is deformed, i.e., expanded, the volume of the ink chamber is decreased and a droplet of ink is ejected from a nozzle communicating with the ink chamber. Japanese Patent Publication P2001-162796A or its corresponding U.S. Pat. No. 6,575,565 discloses such an example of the piezoelectric actuator that includes a number of piezoelectric layers each of which consists of a sheet formed of a piezoelectric material and which are stacked on each other; and a number of electrode layers each of which is formed on a surface of a corresponding one of the piezoelectric layers. When an electric voltage is applied to the electrode layers, the stacked piezoelectric layers are deformed, i.e., expanded and contracted.

The piezoelectric actuator disclosed by the above-identified documents includes nine stacked piezoelectric layers in total. The lower, six piezoelectric layers, located on the side of the cavity unit, are stacked alternately with six electrode layers including three anode layers and three cathode layers that are also stacked alternately with each other. Each of the anode layers includes a plurality of individual electrodes corresponding to a plurality of ink chambers of the cavity unit, respectively; and each of the cathode layers is common to all the ink chambers. A plurality of portions of each of the piezoelectric layers that correspond to the ink chambers, respectively, and that are sandwiched by the individual electrodes of a corresponding one of the anode layers and a plurality of portions of a corresponding one of the cathode layers are polarized to provide a plurality of active portions of the piezoelectric actuator. Thus, the piezoelectric actuator has an active layer including the same number of active portions as the number of the ink chambers of the cavity unit, and is stacked on the cavity unit such that the active portions of the piezoelectric actuator are located above the ink chambers of the cavity unit, respectively.

Meanwhile, the upper, three piezoelectric layers of the piezoelectric actuator provide a restrictive layer that is stacked on the active layer and is not deformed, i.e., is not expanded or contracted. A plurality of portions of the restrictive layer that are located above the active portions of the active layer, respectively, provide a plurality of restrictive portions that restrict respective upward deformations of the active portions and thereby enhance respective downward deformations of the active portions, i.e., respective deformations of the active portions toward the ink chambers of the cavity unit.

Thus, in the piezoelectric actuator disclosed by the above-identified documents, when the electric voltage is applied to the anode and cathode electrodes corresponding to a desired one of the ink chambers, the piezoelectric layers sandwiched by those electrodes are efficiently expanded and contracted toward and away from the desired ink chamber, so that the volume of that ink chamber is decreased and a droplet of ink is ejected from the nozzle communicating with the ink chamber.

Meanwhile, a piezoelectric layer is formed of a ceramic material that is a dielectric material. Therefore, when a potential difference is produced between two electrodes that are opposed to each other to sandwich the piezoelectric layer, the piezoelectric layer has an electrostatic capacitance. In particular, the above-indicated piezoelectric actuator needs, for the purpose of producing an appropriate amount of displacement thereof to be able to eject ink, a plurality of piezoelectric layers that are stacked alternately with a plurality of electrodes. Thus, the piezoelectric actuator as a whole has a great electrostatic capacitance. An electric power consumption of the piezoelectric actuator is expressed as follows: (Electric Power Consumption)$\propto$(Electrostatic Capacitance)$\times$(Drive Voltage Applied To Piezoelectric Actuator)$^2$. Thus, the electric power consumption increases in proportion to the electrostatic capacitance. Since the increasing of the electric power consumption leads to increasing of the cost of a power supply device of the ink jet printer, there has been a demand to decrease the electrostatic capacitance of the piezoelectric actuator.

Electrostatic capacitance is expressed as follows: (Electrostatic Capacitance)=(Dielectric Constant)$\times$(Area Of Each Of Electrodes)/(Distance Between Electrodes). Thus, the electrostatic capacitance can be decreased by increasing the distance between the two electrodes or decreasing the area of each of the electrodes. However, if the distance between the two electrodes is just increased or the area of each of the electrodes is just decreased, then the amount of displacement of the piezoelectric actuator is also decreased and accordingly the amount of change of volume of the ink chamber is decreased, so that the speed of ejection of ink from the nozzle is adversely influenced. Thus, there has been a need to decrease the electrostatic capacitance of the piezoelectric actuator while keeping the amount of displacement thereof sufficient to eject the ink.

SUMMARY OF THE INVENTION

It is therefore an object of the present invention to provide a piezoelectric actuator that is free from the above-identified problem. This object may be achieved according to the present invention.

According to the present invention, there is provided a piezoelectric actuator, comprising a plurality of piezoelectric layers each of which is formed of a piezoelectric material; a plurality of electrode layers which are stacked alternately with the piezoelectric layers; at least one active portion which is provided by respective portions of the piezoelectric layers, such that each of the respective portions is sandwiched by corresponding two electrode layers of the plurality of electrode layers, the corresponding two electrode layers being opposed to each other in a direction of the alternate stacking of the piezoelectric layers and the electrode layers, the at least one active portion being deformed when an electric voltage is applied to the plurality of electrode layers; and the piezoelectric layers including at least one first piezoelectric layer having a first thickness, and at least one second piezoelectric layer having a second thickness greater than the first thickness.

According to this invention, a distance between the two electrode layers which cooperate with each other to sandwich the second or thick piezoelectric layer is greater than a distance between the two electrode layers which cooperate with each other to sandwich the first or thin piezoelectric layer. Thus, an electrostatic capacitance of the thick piezoelectric layer is made smaller than an electrostatic capacitance of the thin piezoelectric layer. This leads to decreasing an electrostatic capacitance of the piezoelectric actuator as a whole, and thereby decreasing a driving power needed to drive the actuator. In addition, in the case where the piezoelectric actuator employs the least number of thick piezoelectric layer or layers (e.g., a single thick piezoelectric layer) only, the amount of displacement (i.e., expansion and contraction) of the active portion as a whole is decreased by the least amount only. That is, the present piezoelectric actuator can enjoy a decreased electrostatic capacity while maintaining a desired amount of displacement of the active portion that is needed, e.g., to eject a droplet of ink from an ink chamber.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described some preferred embodiments of the present invention by reference to the drawings. A piezoelectric-type ink jet printer head as a first embodiment according to the present invention includes a cavity unit 10 and an actuator unit 20.

Figure 1:
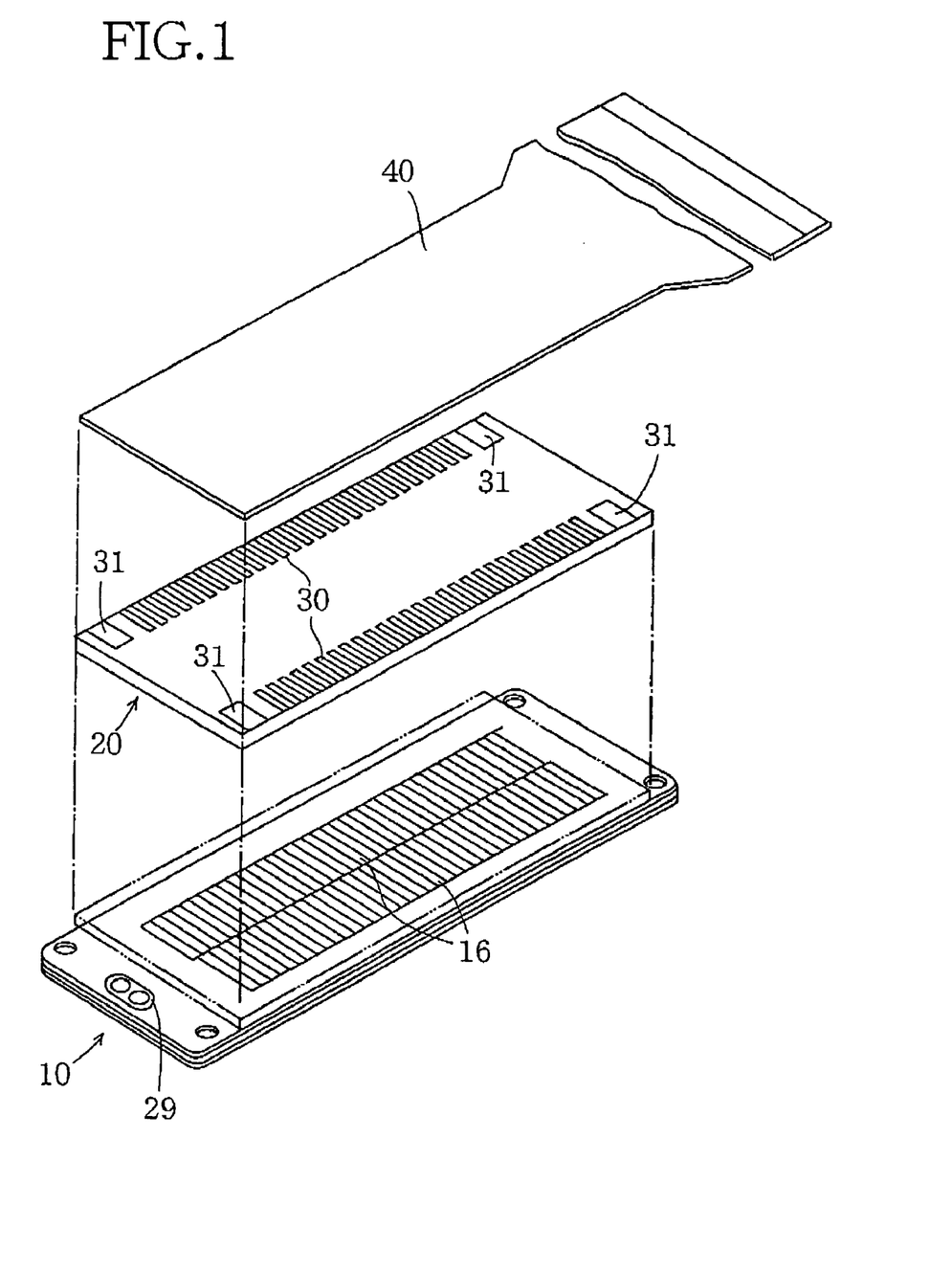
FIG. 1 is a perspective, exploded view of a piezoelectric-type ink jet printer head to which the present invention is applied.

In FIG. 1, the piezoelectric ink jet printer head includes a metallic-sheet-based cavity unit 10; a sheet-type piezoelectric actuator 20 that is stacked on, and bonded to, an upper surface of the cavity unit 10; and a flexible flat cable 40 that is stacked on, and bonded to, an upper surface of the piezoelectric actuator 20, for connecting the actuator 20 to an external device, not shown. The printer head ejects a droplet of ink in a downward direction from each of ink ejection nozzles 15 (FIG. 3) that are open in a lower surface of the cavity unit 10 as the lowermost layer of the printer head.

Figure 2:
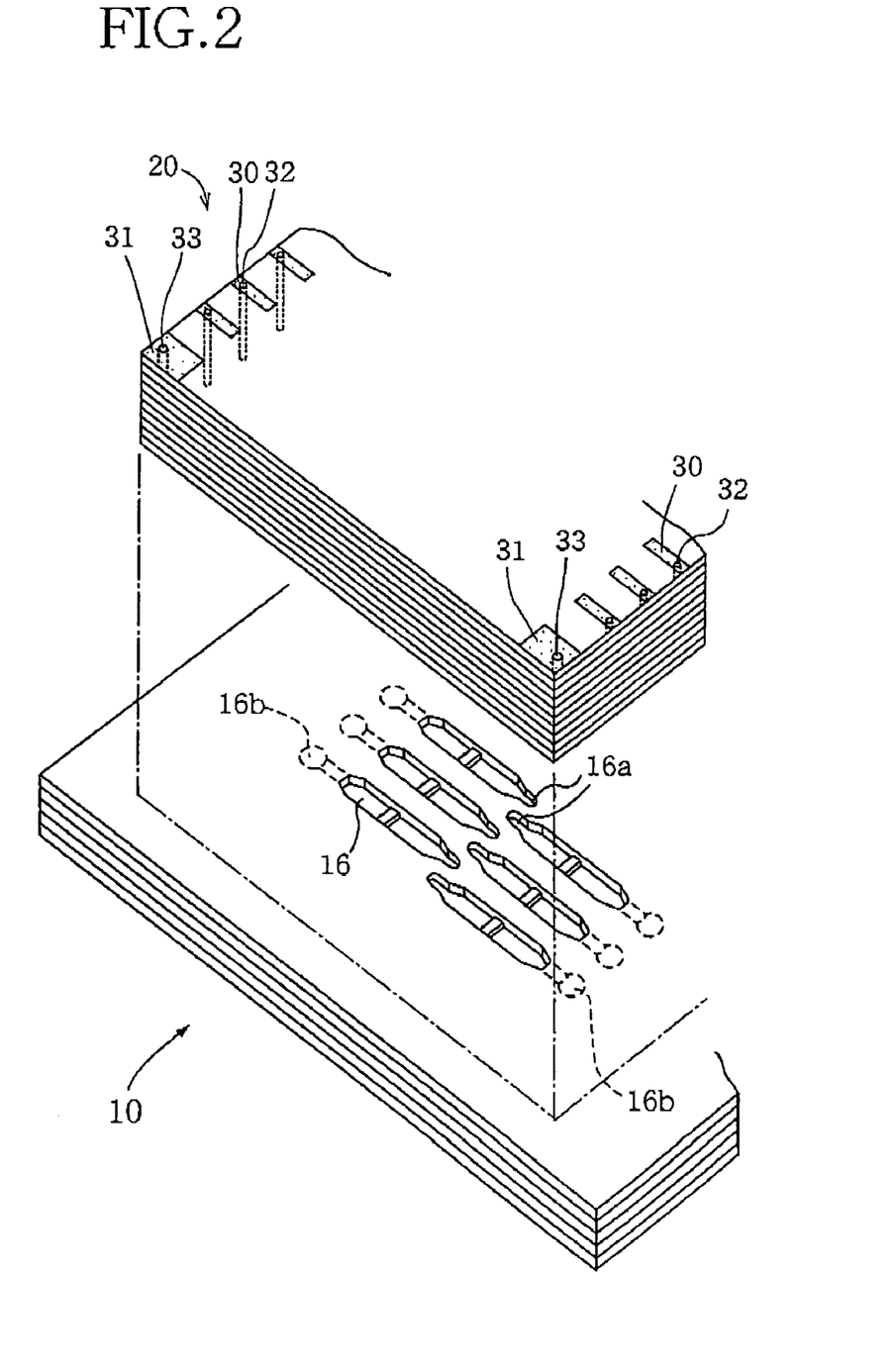
FIG. 2 is a perspective, enlarged view of respective end portions of a cavity unit and a piezoelectric actuator of the printer head.
Figure 3:
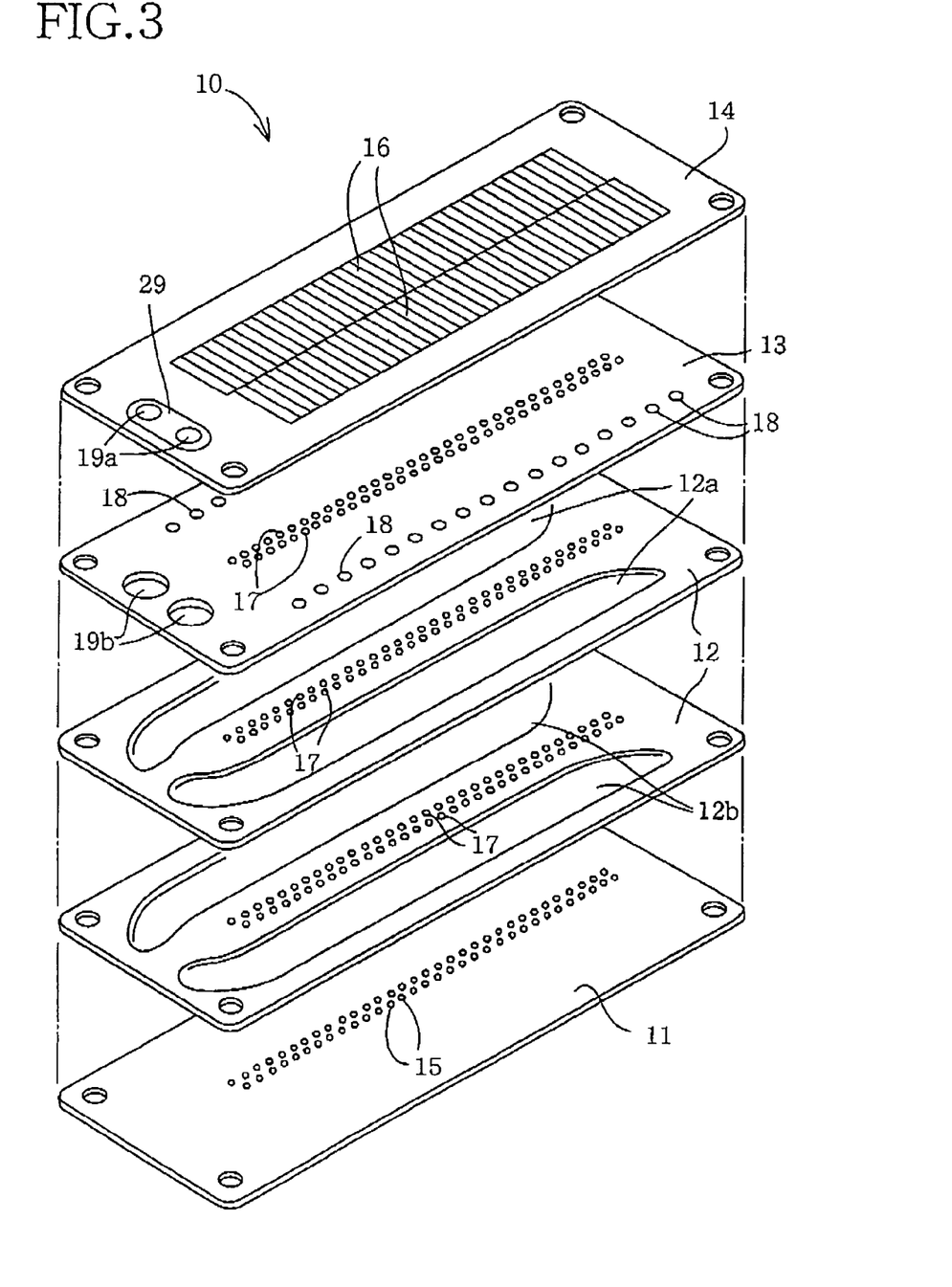
FIG. 3 is a perspective, exploded view of the cavity unit.
Figure 4:
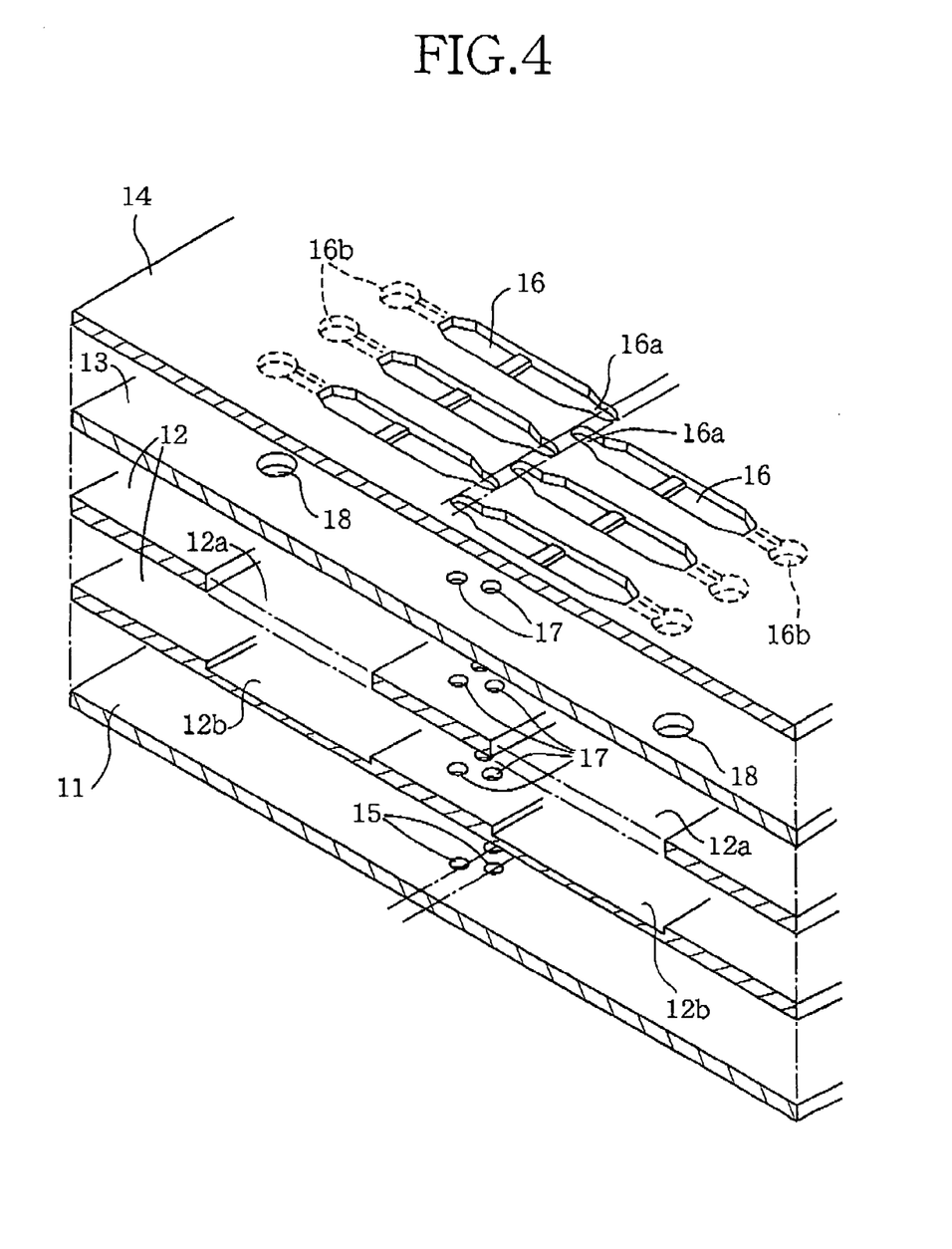
FIG. 4 is a perspective, enlarged view of a portion of the cavity unit.

As shown in FIGS. 2, 3, and 4, the cavity unit 10 includes five thin sheets stacked on each other. The five thin sheets include a nozzle sheet 11, two manifold sheets 12, 12, a spacer sheet 13, and a base sheet 14.

In the present embodiment, the four sheets 12, 12, 13, 14, except for the nozzle sheet 11, are each formed of a 42% nickel alloy steel sheet, and have respective thickness values each of which falls in the range of from 50 µm to 150 µm. The nozzle sheet 11 is formed of a synthetic resin. The nozzle sheet 11 has two arrays of ink ejection nozzles 15 each having a small diameter (e.g., 25 µm), such that the two arrays of nozzles 15 are arranged in a staggered or zigzag fashion, in a first direction (i.e., a lengthwise direction) of the cavity unit 10 or the printer head. More specifically described, the nozzles 15 are formed through the thickness of the nozzle sheet 11, in two arrays in a zigzag fashion and at a small regular interval in each array.

As shown in FIGS. 3 and 4, an upper one of the two manifold sheets 12, 12 has two ink manifolds 12a, 12a that are formed through the thickness of the upper sheet 12, such that the two ink passages 12a, 12a extend along, and outside, the two arrays of nozzles 15, respectively, in the first direction of the cavity unit 10. The lower manifold sheet 12 has two ink passages 12b, 12b that are open in only an upper surface thereof, are aligned with the two ink passages 12a, 12a, respectively, and have substantially the same plan-view shape as that of the ink passages 12a, 12a. Each of the two ink passages 12b, 12b cooperates with a corresponding one of the two ink passages 12a, 12a to define an ink manifold. The two ink manifolds 12a, 12b; 12a, 12b are fluid-tightly closed by the spacer sheet 13 stacked on the upper manifold sheet 12.

Also, as shown in FIGS. 3 and 4, the base sheet 14 has two arrays of elongate ink chambers 16 that are formed through the thickness of the sheet 14, such that each of the ink chambers 16 extends in a second direction (i.e., a widthwise direction) of the cavity unit 10 or the printer head that is perpendicular to the first direction (i.e., the lengthwise direction) of the unit 10 or the head. The two arrays of ink chambers 16 are arranged in a zigzag fashion in the first direction.

As shown in FIGS. 2 and 4, respective inner end portions 16a of the pressure chambers 16, arranged in the two arrays in the zigzag fashion in the base sheet 14, are located in a widthwise middle portion of the base sheet 14, and communicate with the respective nozzles 15, also arranged in the two arrays in the zigzag fashion in the nozzle sheet 11, via respective through-holes 17 each of which has a small diameter and which are formed through the thickness of each of the spacer sheet 13 and the two manifold sheets 12, 12. The through-holes 17 provide respective ink channels connecting between the ink chambers 16 and the corresponding ink ejection nozzles 15.

On the other hand, respective outer end portions 16b of the ink chambers 16 of one array communicate with a corresponding one of the two ink manifolds 12a, 12b; 12a, 12b of the two manifold sheets 12, 12 via a corresponding one array of through-holes 18 out of two arrays of through-holes 18 that are formed through the thickness of the spacer sheet 13; and respective outer end portions 16b of the ink chambers 16 of the other array communicate with the other ink manifold 12a, 12b via the other array of through-holes 18 of the spacer sheet 13. As shown in FIGS. 2 and 4, the other end portions 16b of the ink chambers 16 are open in only a lower surface of the base sheet 14. In addition, as shown in FIG. 3, the base sheet 14 as the uppermost layer of the cavity unit 10 has, in one of lengthwise opposite end portions thereof, two ink supply holes 19a that are formed through the thickness of the sheet 14 and communicate with the two ink passages 12a, 12a of the upper manifold sheet 12, respectively; and the spacer sheet 13 has, in one of lengthwise opposite end portions thereof, two ink supply holes 19b that are formed through the thickness of the sheet 13 and communicate with the two ink supply holes 19a of the base sheet 14, respectively, and the two ink passages 12a, 12a of the upper manifold sheet 12, respectively. The two ink supply holes 19a of the base sheet 14 as the uppermost layer are equipped with a filter 29 that removes dust from respective inks supplied from two ink tanks, not shown, provided above the sheet 14.

The respective inks supplied from the two ink tanks to the two ink manifolds 12a, 12b; 12a, 12b via the supply holes 19a, 19b of the base sheet 14 and the spacer sheet 13, are delivered to the ink chambers 16 via the respective through-holes 18, and then are supplied, via the through-holes 17, to the ink ejection nozzles 15 communicating with the ink chambers 16, respectively.

Figure 5:
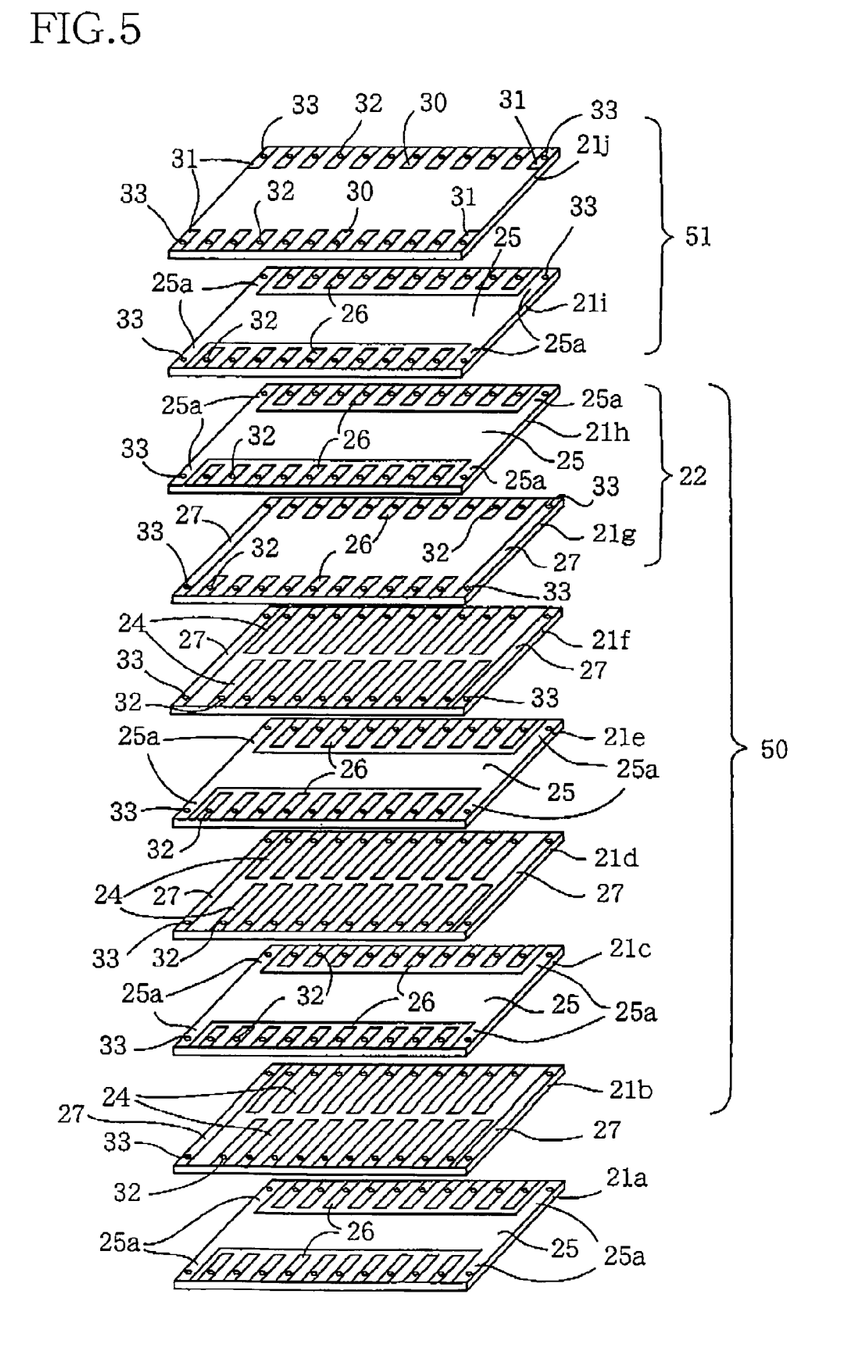
FIG. 5 is a perspective, exploded view of the piezoelectric actuator.
Figure 7:
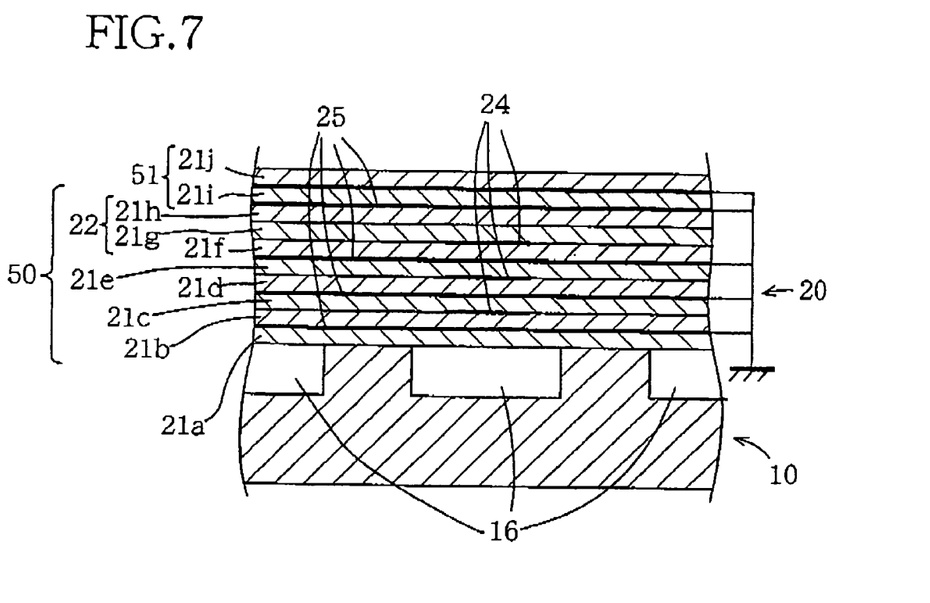
FIG. 7 is a longitudinal cross section view of a portion of the printer head.

The piezoelectric actuator 20 includes a plurality of piezoelectric layers and a plurality of electrode layers that are alternately stacked on each other. Each of the piezoelectric layers includes one or more piezoelectric sheets each formed of a piezoelectric ceramic. As shown in FIGS. 5 and 7, the piezoelectric actuator 20 has a construction in which ten piezoelectric sheets 21a, 21b, 21c, 21d, 21e, 21f, 21g, 21h, 21i, 21j are stacked on each other. The ten piezoelectric sheets 21 each have a same thickness that falls in the range of from 10 µm to 150 µm. Each of the electrode layers includes a metallic film formed on an upper, major surface of a corresponding one of the ten piezoelectric sheets 21.

As shown in FIG. 5, the second through eighth piezoelectric sheets 21b, 21c, 21d, 21e, 21f, 21g, 21h, as counted upward from the cavity unit 10, cooperate with each other to provide an active layer 50 including a plurality of active portions which correspond to the plurality of ink chambers 16, respectively, and each of which can be deformed, i.e., expanded and contracted to eject a droplet of ink from a corresponding one of the ink chambers 16. The ninth and tenth piezoelectric sheets 21i, 21j, as counted in the upward direction, cooperate with each other to provide a restrictive layer 51 including a plurality of restrictive portions which restrict respective upward deformations of the active portions of the active layer 50.

On an upper surface of each of the second, fourth, and sixth piezoelectric sheets 21b, 21d, 21f as counted in the upward direction, there is provided a proper individual electrode layer including a plurality of elongate proper individual electrodes 24 corresponding to the ink chambers 16 of the cavity unit 10, respectively. More specifically described, the proper individual electrodes 24 are arranged in two arrays in a zigzag fashion in a first direction (i.e., a lengthwise direction) of the piezoelectric actuator 20 or the printer head, and each of the proper individual electrodes 24 extends in a second direction perpendicular to the first direction, and reaches a position in the vicinity of a corresponding one of two long sides of the each piezoelectric sheet 21b, 21d, 21f.

In addition, on an upper surface of each of the first, third, fifth, and eighth piezoelectric sheets 21a, 21c, 21e, 21h as counted in the upward direction, there is provided a proper common electrode 25 that is common to all the ink chambers 16

Figure 6:
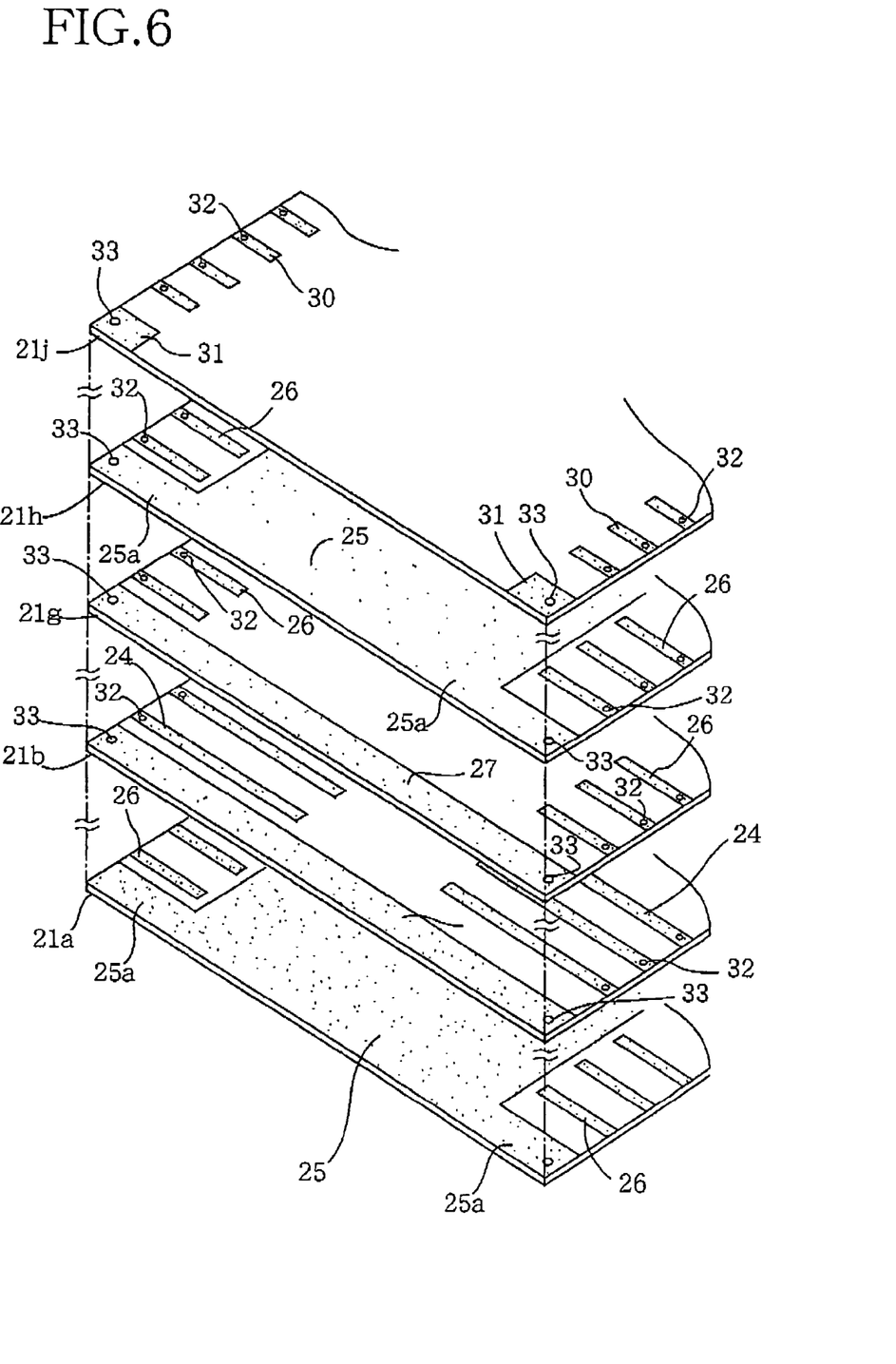
FIG. 6 is a perspective, enlarged view of a portion of the piezoelectric actuator.

In the present embodiment, as shown in FIG. 7, each of the proper individual electrodes 24 has a width more or less smaller than that of each of the ink chambers 16. On the other hand, as shown in FIGS. 5 and 6, each of the proper common electrodes 25 has, in its plan view, a rectangular shape that extends, on a widthwise middle portion of the corresponding piezoelectric sheet 21a, 21c, 21e, 21h, in the lengthwise direction of the same 21a, 21c, 21e, 21h, such that the each proper common electrode 25 extends over all the ink chambers 16 that are arranged, in the widthwise middle portion of the cavity unit 10, in the two arrays in the first direction (i.e., the lengthwise direction) of the same 10. Each of the proper common electrodes 25 is integral with two lead portions 25a, 25a that are provided on the two lengthwise opposite end portions of the corresponding piezoelectric sheet 21a, 21c, 21e, 21h, respectively, such that the two lead portions 25a, 25a extend over the respective entire lengths of the two lengthwise opposite end portions. Thus, each of the piezoelectric sheets 21a, 21c, 21e, 21h has, on the upper surface thereof, two widthwise opposite end portions which are free of the corresponding proper common electrode 25 and lead portions 25a and on which two arrays of dummy individual electrodes 26 are provided, respectively. The dummy individual electrodes 26 are formed at respective positions that are aligned, in the direction of stacking of the piezoelectric sheets 21, with the proper individual electrodes 24 of each proper individual electrode layer, and have a width substantially equal to that of the same 24 and a length shorter than that of the same 24.

On the upper surface of each of the second, fourth, and sixth piezoelectric sheets 21b, 21d, 21f, there are provided two dummy common electrodes 27, 27 at respective positions that are aligned, in the direction of stacking of the piezoelectric sheets 21, with the two lead portions 25a, 25a of each proper common electrode 25.

On the seventh piezoelectric sheet 21g located between the sixth sheet 21f and the eighth sheet 21h, there are provided no proper individual electrodes 24 nor proper common electrode 25. This means that between the proper individual electrodes 24 on the upper surface of the sixth sheet 21f and the proper common electrode 25 on the upper surface of the eighth sheet 21h, there is provided a thick piezoelectric layer 22 having a thickness equal to twice the thickness of each of the ten piezoelectric sheets 21a to 21j.

However, like on each of the second, fourth, and sixth piezoelectric sheets 21b, 21d, 21f, there are provided, on the seventh sheet 21g, dummy individual electrodes 26 connecting between the proper individual electrodes 24 on the sixth sheet 21f and the dummy individual electrodes 26 on the eighth sheet 21h, via respective electrically conductive materials filling through-holes 32 (described later) formed through the respective thickness of the seventh and eighth sheets 21g, 21h, and there are additionally provided two dummy common electrodes 27 connecting between the two dummy common electrodes 27 on the sixth sheet 21f and the two lead portions 25a on the eighth sheet 21h, via respective electrically conductive materials filling through-holes 33 (described later) formed through the respective thickness of the seventh and eighth sheets 21g, 21h.

Thus, each of the second through sixth piezoelectric sheets 21b, 21c, 21d, 21e, 21f, and the pair of seventh and eighth sheets 21g, 21h is sandwiched by the proper individual electrodes 24 of the corresponding proper individual electrode layer, and the corresponding proper common electrode 25. Therefore, if the proper common electrodes 25 are grounded via the electrically conductive materials filling the through-holes 33, as known in the art, and a positive high voltage suitable for polarization is applied to all the proper individual electrodes 24, respective portions of the each piezoelectric sheet 21b, 21c, 21d, 21e, 21f, 21g, 21h that are sandwiched by the proper individual electrodes 24 and the proper common electrode 25 are polarized in a direction from the former electrodes 24 toward the latter electrode 25. Thus, the respective polarized portions of the piezoelectric sheets 21b, 21c, 21d, 21e, 21f, 21g, 21h provide the plurality of active portions of the active layer 50. When all the common electrodes 25 are grounded as known in the art and a positive low voltage suitable for driving the piezoelectric actuator 20 is applied to one or more desired individual electrodes 24, one or more corresponding active portions are deformed, i.e., expanded and contracted, owing to longitudinal piezoelectric effect. In the present embodiment, the thick piezoelectric layer 22 which includes the two piezoelectric sheets 21g, 21h and whose thickness is equal to twice the thickness of each piezoelectric sheet 21a to 21j is the uppermost sub-layer of the active layer 50, as shown in FIG. 7.

The restrictive layer 51 is for restricting the deformation of each active portion of the active layer 50 in a direction away from the corresponding ink chamber 16. On the upper surface of an upper one 21j of the two piezoelectric sheets 21i, 21j of the restrictive layer 51, there are provided two arrays of individual surface electrodes 30 that extend along two long sides of the upper sheet 21j, respectively, and correspond to the two arrays of proper individual electrodes 24 of each proper individual electrode layer; and four common surface electrodes 31 that correspond to each proper common electrode 25. On the lower sheet 21i of the restrictive layer 51, there are provided dummy individual electrodes 26 connecting between the dummy individual electrodes 26 on the underlying sheet 21h and the individual surface electrodes 30 on the upper sheet 21j, via respective electrically conductive materials filling through-holes 32, described later, formed through the respective thickness of the sheets 21i, 21j; and two lead portions 25a connecting between the two lead portions 25a on the underlying sheet 21h and the common surface electrodes 31 on the upper sheet 21j, via respective electrically conductive materials filling through-holes 33, described later, formed through the respective thickness of the sheets 21i, 21j. The two lead portions 25a on the lower sheet 21i of the restrictive layer 51 are integral with a common electrode 25 provided on the sheet 21i. Since each of the two piezoelectric sheets 21i, 21j of the restrictive layer 51 is not sandwiched by a proper common electrode 25 and proper individual electrodes 24 of a proper individual electrode layer, no portions of the each sheet 21i, 21j are polarized when the polarizing voltage is applied to the piezoelectric actuator 20 as described above, or are deformed when the driving voltage is applied to the same 20. Generally, it is not needed to provide any electrodes on the lower sheet 21i of the restrictive layer 51. The reason why, in the present embodiment, the proper common electrode 25 is provided on the lower sheet 21i is that there is some difference between a percentage of firing-caused shrinkage of a piezoelectric sheet on which one or more electrodes are provided, and that of a piezoelectric sheet on which no electrodes are provided. This difference causes warpage or curving of the piezoelectric actuator 20 as a whole. To avoid this problem, the proper common electrode 25 is intentionally provided on the lower sheet 21i. However, if a potential difference is produced between an electrode provided on the lower sheet 21i and another electrode that is opposed to that electrode, then an electrostatic capacitance is produced. Hence, the proper common electrode 25 that is identical with the electrode 26 provided on the underlying sheet 21h is intentionally provided on the lower sheet 21i, too, for the purpose of preventing the electrode 25 provided on the sheet 21i from adversely affecting the operation of the piezoelectric actuator 20.

Each of the piezoelectric sheets 21b–21j, except for the lowermost sheet 21a, has two arrays of through-holes 32 formed through the thickness thereof, so that each of the individual surface electrodes 30, and all the proper and dummy individual electrodes 24, 26 aligned with the each individual surface electrode 30 in the direction of stacking of sheets 21a–21j are electrically connected to each other via the electrically conductive material filling the through-holes 32. Similarly, each of the piezoelectric sheets 21b–21j, except for the lowermost sheet 21a, has four through-holes 33 formed through the thickness thereof, so that each of the four common surface electrodes 31 and all the lead portions 25a of the proper common electrodes 25 and all the dummy common electrodes 27 that are aligned with the each common surface electrode 31 in the direction of stacking of sheets 21a–21j are electrically connected to each other via the electrically conductive material filling the through-holes 33. However, it is possible to connect electrically at least one of the four common surface electrodes 31 to a corresponding one of the two lead portions 25a integral with the proper common electrode 25 provided on the ninth sheet 21i.

When the piezoelectric actuator 20 is manufactured, first, the through-holes 32, 33 are formed through the thickness of each piezoelectric sheet 21b to 21j in the form of a ceramic green sheet. Then, appropriate electrodes 24, 25, 25a, 26, 27, 30, 31 are formed, by printing, on each green sheet and simultaneously the through-holes 32, 33 of the each green sheet are filled with an electrically conductive material. Subsequently, those green sheets are stacked on each other, such that each of the electrodes 24, 25a, 26, 27, 30, 31 is aligned with one or more corresponding through-holes 32, 33. The thus stacked green sheets are fired as known in the art, and the piezoelectric actuator 20 is produced.

The sheet-type piezoelectric actuator 20 constructed as described above is fixed to the cavity unit 10, such that the plurality of proper individual electrodes 24 of each proper individual electrode layer of the actuator 20 are aligned with the plurality of ink chambers 16 of the cavity unit 10, respectively, as shown in FIGS. 1, 2, and 7. In addition, the flexible flat cable 40 is stacked and pressed on the upper surface of the piezoelectric actuator 20, so that various wiring patterns of the flat cable 40 are electrically connected to the individual and common surface electrodes 30, 31 of the actuator 20.

When an electric voltage is applied to the proper individual electrodes 24 and the proper common electrodes 25 of an arbitrary one of the active portions of the piezoelectric actuator 20, the respective portions of the piezoelectric sheets 21b to 21h of the arbitrary active portion, sandwiched by the proper individual electrodes 24 and the proper common electrodes 25 to which the electric voltage is applied, are deformed in the direction of stacking of the sheets 21b to 21h. Since, however, the upward deformation of that active portion is restricted by the restrictive layer 51, the displacement of the active portion largely occurs on the side of the corresponding ink chamber 16, so that the volume of the ink chamber 16 is efficiently decreased and a droplet of ink is ejected from the nozzle 15 communicating with the ink chamber 16 so as to record an image on a recording medium, not shown.

As shown in FIG. 7, in the piezoelectric actuator 20 constructed as described above, the active layer 50 includes, as the uppermost layer of each active portion, the thick piezoelectric layer 22 including the piezoelectric sheet 21g on which no proper individual or common electrodes 24, 25 are provided. Therefore, the distance between the proper individual electrodes 24 provided on the upper surface of the piezoelectric sheet 21f, and the proper common electrode 25 provided on the upper surface of the piezoelectric sheet 21h and opposed to the proper individual electrodes 24 via the thick layer 22, is twice the distance between the proper individual and common electrodes 24, 26 that are opposed to each other via each one of the other piezoelectric sheets 21b through 21f. Thus, as is apparent from the previously-indicated expression: (Electrostatic Capacitance)=(Dielectric Constant)×(Area Of Each OF Electrodes)/(Distance Between Electrodes), the electrostatic capacitance of the thick layer 22 can be reduced by half. This leads to reducing the electrostatic capacitance of the piezoelectric actuator 20 as a whole and thereby reducing the electric power needed to drive the actuator 20.

Since the thick layer 22 is the uppermost layer of each active portion that is the most distant from the corresponding ink chamber 16 and is held in contact with the restrictive layer 51, the increased distance between the proper individual and common electrodes 24, 25 opposed to each other via the thick layer 22 does not adversely affect the amount of displacement of the each active portion or the amount of change of volume of the corresponding ink chamber 16. Thus, the electrostatic capacitance of each active portion can be effectively reduced while the amount of displacement of the same is maintained.

While the present invention has been described in detail in its preferred embodiment, it is to be understood that the present invention is not limited to the details of the described embodiment and may be embodied with various changes and improvements.

Figure 8:
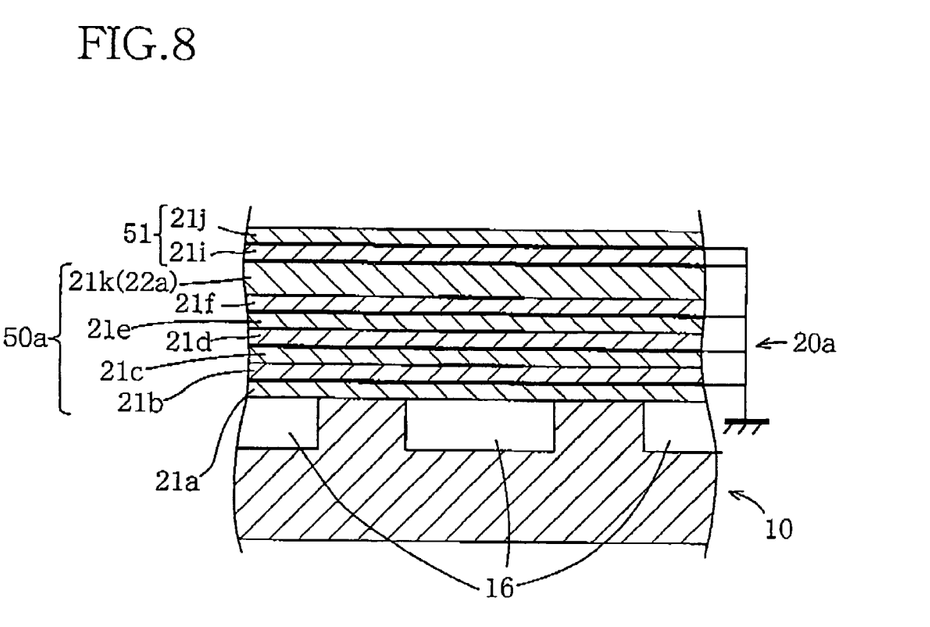
FIG. 8 is a longitudinal cross section view of a portion of another piezoelectric-type ink jet printer head as a second embodiment of the present invention.

For example, the thick layer 22 including the two piezoelectric sheets 21g, 21h may be replaced by a single piezoelectric sheet having a greater thickness than that of each of the other piezoelectric sheets 21a to 21f, 21i, 21j. FIG. 8 shows another piezoelectric actuator 20a including, in place of the thick layer 22, i.e., the piezoelectric sheets 21g, 21h, a single piezoelectric sheet 21k whose thickness is greater (e.g., twice greater) than that of each of the other piezoelectric sheets 21a to 21f, 21i, 21j. In this case, the single piezoelectric sheet 21k provides a thick layer 22a of an active layer 50a. On an upper surface of the piezoelectric sheet 21k, there are provided the same electrodes as those provided on the upper surface of the piezoelectric sheet 21h shown in FIG. 5. Therefore, the distance between the proper individual electrodes 24 on the upper surface of the piezoelectric sheet 21f and the proper common electrode 25 on the upper surface of the piezoelectric sheet 21k is greater than the distance between the proper individual and common electrodes 24, 25 that are opposed to each other via each one of the other piezoelectric sheets 21b to 21f. Thus, in this embodiment, too, the electrostatic capacitance of the piezoelectric actuator 20a as a whole can be reduced. Since the thick layer 22a is provided by the single piezoelectric sheet 21k having the greater thickness, the thickness of the thick layer 22a can be freely designed by employing a piezoelectric sheet having a desired thickness.

Figure 9:
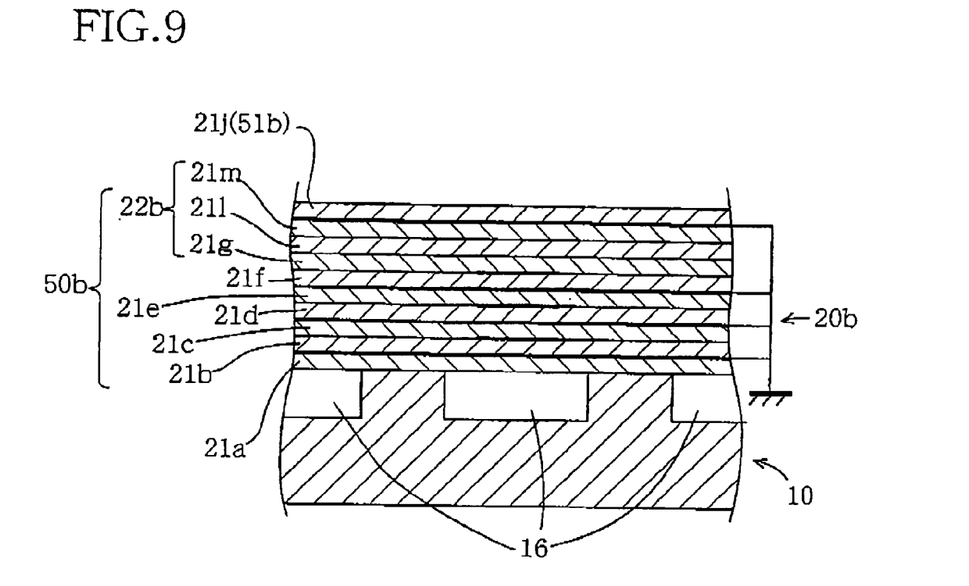
FIG. 9 is a longitudinal cross section view of a portion of another piezoelectric-type ink jet printer head as a third embodiment of the present invention.

Alternatively, the thick layer 22 including the two piezoelectric sheets 21g, 21h may be replaced by a thick layer including three or more piezoelectric sheets each of which has a thickness equal to that of each of the other piezoelectric sheets. FIG. 9 shows another piezoelectric actuator 20b including, in place of the thick layer 22, i.e., the piezoelectric sheets 21g, 21h, three piezoelectric sheets 21g, 21l, 21m each of which has a thickness equal to that of each of the other piezoelectric sheets 21a to 21f, 21j. In this case, the three piezoelectric sheets 21g, 21l, 21m cooperate with each other to provide a thick layer 22b of an active layer 50b. On an upper surface of the piezoelectric sheet 21m, there are provided the same electrodes as those provided on the upper surface of the piezoelectric sheet 21h shown in FIG. 5; and on upper surface of each of the two piezoelectric sheets 21g, 21l interposed between the two piezoelectric sheets 21f, 21m, there are provided no proper individual or common electrodes 24, 25. Thus, the distance between the proper individual electrodes 24 on the upper surface of the piezoelectric sheet 21f and the proper common electrode 25 on the upper surface of the piezoelectric sheet 21m, i.e., the thickness of the thick layer 22b is three times the distance between the proper individual and common electrodes 24, 25 that are opposed to each other via each one of the other piezoelectric sheets 21b to 21f. Thus, in this embodiment, too, the electrostatic capacitance of the piezoelectric actuator 20b as a whole can be reduced. In the piezoelectric actuator 20b, the single piezoelectric sheet 21j provides a restrictive layer 51b. In the present embodiment, since the thickness of the thick layer 22b can be easily changed by changing the total number of piezoelectric sheets 21g, 21l, 21m stacked on each other, the piezoelectric actuator 20b can be easily manufactured by using a single sort of piezoelectric sheets each having a same thickness.

Figure 10:
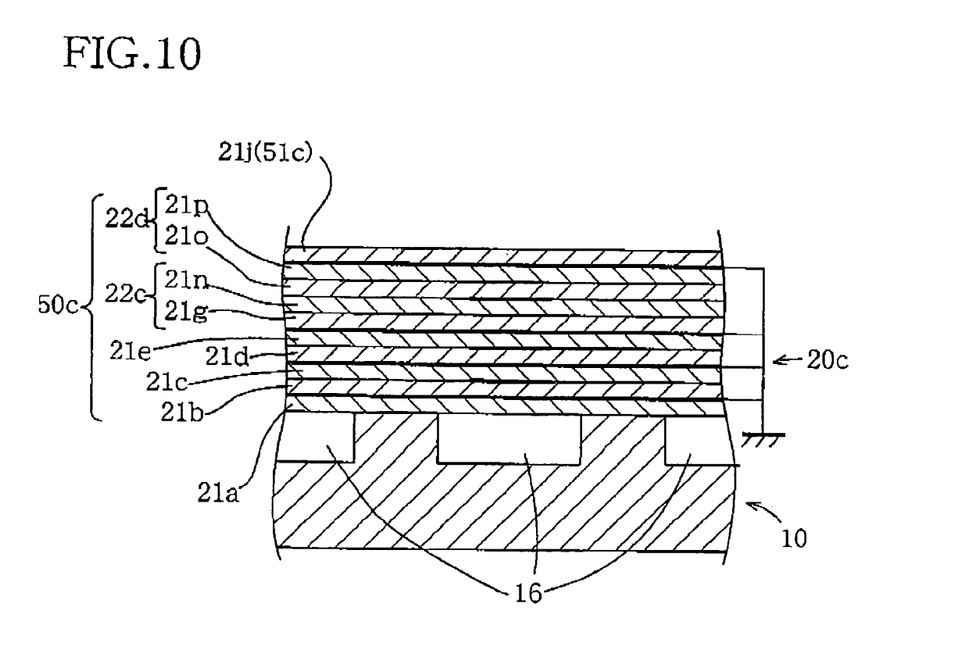
FIG. 10 is a longitudinal cross section view of a portion of another piezoelectric-type ink jet printer head as a fourth embodiment of the present invention.

Alternatively, the single thick layer 22 including the two piezoelectric sheets 21g, 21h may be replaced by a plurality of thick layers each of which includes two or more piezoelectric sheets each of which has a thickness equal to that of each of the other piezoelectric sheets. FIG. 10 shows another piezoelectric actuator 20c including, in place of the thick layer 22, i.e., the piezoelectric sheets 21g, 21h, four piezoelectric sheets 21g, 21n, 21o, 21p. In this case, the two piezoelectric sheets 21g, 21n cooperate with each other to provide a first thick layer 22c of an active layer 50c; and the two piezoelectric sheets 21o, 21p cooperate with each other to provide a second thick layer 22d of the active layer 50c. On an upper surface of the piezoelectric sheet 21g provided on the five piezoelectric sheets 21a to 21e, there are provided no proper individual or common electrodes 24, 25; on an upper surface of the piezoelectric sheet 21n on the piezoelectric sheet 21g, there are provided the same electrodes as those provided on the upper surface of the piezoelectric sheet 21f shown in FIG. 5; on an upper surface of the piezoelectric sheet 21o on the piezoelectric sheets 21n, there are provided no proper individual or common electrodes 24, 25; and, on an upper surface of the piezoelectric sheet 21p on the piezoelectric sheet 21o, there are provided the same electrodes as those provided on the upper surface of the piezoelectric sheet 21h shown in FIG. 5. Thus, the piezoelectric actuator 20c includes the two thick layers 22c, 22d. In this embodiment, too, the electrostatic capacitance of the piezoelectric actuator 20b as a whole can be reduced. In the piezoelectric actuator 20c, the single piezoelectric sheet 21j provides a restrictive layer 51c.

Although the present invention has been described in its various embodiments, it is to be understood that the present invention may otherwise be embodied. For example, the total number of the thick layer or layers 22 of the active layer 50, the thickness of the thick layer, or each thick layer, 22, and/or the position or respective positions of the thick layer or layers 22 relative to the cavity unit 10 or the pressure chambers 16 thereof may be changed. In particular, in the embodiment shown in FIG. 8, the thickness of the thick layer 22a (21k) may be greater, by not less than 50%, than the thickness of each thin layer 21b through 21f. Moreover, in each of the illustrated embodiments, the total number of the piezoelectric layers of the active layer 50 and the number of the thick layer or layers 22 may be modified such that the number of the thick layer or layers 22 is not greater than half the total number of the piezoelectric layers of the active layer 50. In addition, the structure of the restrictive layer 51 may be modified, as needed. However, if the thick layer 22 is provided as a layer that directly faces the ink chambers 16, the thick layer 22 may decrease the amount of displacement of each active portion, i.e., the amount of change of volume of each ink chamber 16. Thus, it is preferred that the thick layer 22 be provided as a layer that does not directly face the ink chambers 16, i.e., as an intermediate or upper sub-layer of the active layer 50.

The present invention may be applied to such a piezoelectric actuator in which the electrode layers are stacked in a different order than the order shown in FIG. 5, for example, a piezoelectric actuator in which proper individual electrodes 24 are provided on a piezoelectric sheet as the lowermost piezoelectric sheet of the actuator that faces the ink chambers 16 of the cavity unit 10. In addition, the present invention may be applied to such a piezoelectric actuator in which the through-holes 32, 33 are replaced with side electrodes that are provided on one or more side surfaces of a stacked body of the actuator that is or are perpendicular to the major surface on which the individual and common surface electrodes 30, 31 are provided. In this case, the proper individual electrodes 24 and the dummy individual electrodes 26 of each active portion of the active layer are electrically connected to the corresponding individual surface electrode 30 via the corresponding side electrodes; and the proper common electrodes 25 and the dummy common electrodes 27 are electrically connected to the individual surface electrodes 31 via the other side electrodes. In addition, in this case, grooves may be formed in the one or more side surfaces of the stacked body of the piezoelectric actuator that is or are perpendicular to the top and bottom major surfaces of the actuator, such that at least the above-indicated drive electrodes (i.e., the individual electrodes 24, 26 and the common electrodes 25, 27) are exposed in the grooves, and the side electrodes electrically connecting the drive electrodes to each other are provided in the grooves.

The present piezoelectric actuator 20, 20a, 20b, 20c may be employed by not only the ink jet printer head but also other devices.

EXAMPLES

Next, Examples 1, 2, and 3 each according to the present invention will be described in comparison with Comparative Example, shown in FIG. 11, corresponding to a conventional piezoelectric actuator in which no thick piezoelectric layer is employed.

Invention Example 1 corresponds to the piezoelectric actuator 20, shown in FIG. 7, including the active layer 50 including the seven piezoelectric sheets 21b to 21h. Each of the active portions of the active layer 50 includes six piezoelectric layers each of which is sandwiched by the corresponding proper individual electrode 24 and the corresponding proper common electrode 25, and the uppermost layer of the six piezoelectric layers is provided by the single thick layer 22 including the two sheets 21g, 21h. Since each of the piezoelectric sheets 21a to 21j has a thickness of 30 µm, the thick layer 22 has a thickness of 60 µm that is twice greater than that of each of the other, five piezoelectric layers.

Invention Example 2 corresponds to the piezoelectric actuator 20b, shown in FIG. 9, including the active layer 50b including the eight piezoelectric sheets 21b to 21f and 21g to 21m. Each of the active portions of the active layer 50b includes six piezoelectric layers each of which is sandwiched by the corresponding proper individual electrode 24 and the corresponding proper common electrode 25, and the uppermost layer of the six piezoelectric layers is provided by the single thick layer 22b consisting of the three sheets 21g, 21l, 21m. Since each of the piezoelectric sheets 21a to 21g, 21j, 21l, 21m has a thickness of 30 µm, the thick layer 22b has a thickness of 90 µm that is three times greater than that of each of the other, five piezoelectric layers.

Invention Example 3 corresponds to the piezoelectric actuator 20c, shown in FIG. 10, including the active layer 50c including the eight piezoelectric sheets 21b to 21e, 21g, 21n, 21o, 21p. Each of the active portions of the active layer 50c includes six piezoelectric layers each of which is sandwiched by the corresponding proper individual electrode 24 and the corresponding proper common electrode 25, and the uppermost and second uppermost layers of the six piezoelectric layers are provided by the two thick layers 22c, 22d, respectively, one of which consists of the two sheets 21g, 21n and the other of which consists of the two sheets 21o, 21p The two thick layers 22c, 22d are stacked on each other. Since each of the piezoelectric sheets 21a to 21e, 21g, 21n, 21o, 21p has a thickness of 30 µm, each of the two thick layers 22c, 22d has a thickness of 60 µm that is twice greater than that of each of the other, four piezoelectric layers.

Figure 11:
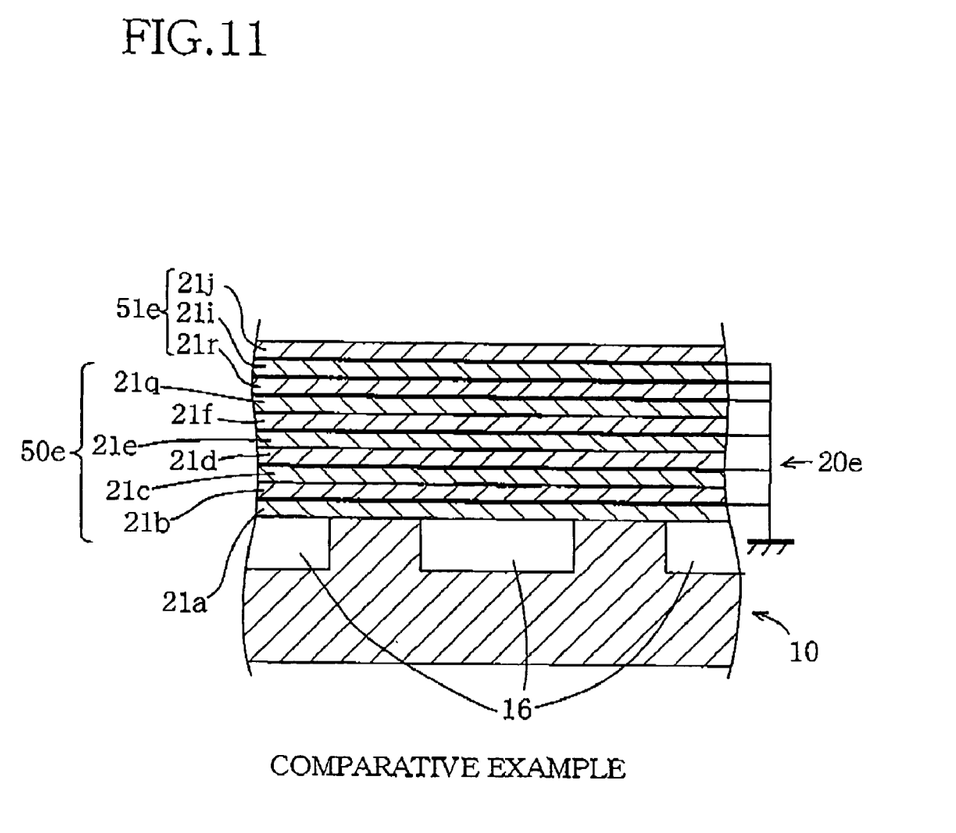
FIG. 11 is a longitudinal cross section view of a portion of a conventional piezoelectric-type ink jet printer head as a comparative example.

Comparative Example, i.e., a piezoelectric actuator 20e shown in FIG. 11 includes ten piezoelectric sheets 21a to 21f, 21i, 21j, 21q, 21r that have a same thickness. The piezoelectric actuator 20e includes an active layer 50e including the second to seventh piezoelectric layers 21b, 21c, 21d, 21e, 21f, 21q, as counted upward from a cavity unit 10; and a restrictive layer 51e consisting of the eight to tenth piezoelectric layers 21r, 21i, 21j as counted in the upward direction. In the active layer 50e, on an upper surface of each of the second, fourth, and sixth sheets 21b, 21d, 21f, there is provided the same electrode layer as the electrode layer including the proper individual electrodes 24, shown in FIG. 7; and, on an upper surface of each of the first, third, fifth and seventh sheets 21a, 21c, 21e, 21q, there is provided the same electrode layer as the electrode layer including the proper common electrode 25, shown in FIG. 7. Meanwhile, in the restrictive layer 51e, on an upper surface of the uppermost piezoelectric sheet 21j, there are provided individual and common surface electrodes (not shown in FIG. 11); and, on an upper surface of each of the eighth and ninth sheets 21r, 21i, there is provided the same electrode layer as the electrode layer provided on the seventh layer 21q, such that the electrode layer is electrically grounded not to affect adversely the operation of the actuator 20e.

In Comparative Example, the active layer 50e consists of the six piezoelectric sheets 21b to 21f, 21q that are stacked on each other, and each of the active portions of the active layer 50e includes six piezoelectric layers each of which is sandwiched by the corresponding proper individual electrode 24 and the corresponding proper common electrode 25. Since each of the six piezoelectric sheets 21a to 21f, 21i, 21j, 21q, 21r has a thickness of 30 µm, each of the six piezoelectric layers has the same thickness of 30 µm.

In Invention Examples 1, 2, and 3 and Comparative Example, the respective areas of the proper and dummy individual electrodes 24, 26 used, the respective total numbers of the proper and dummy individual electrodes 24, 26, the length of the active portions of the active layer 50, 50b, 50c, 50e, the pitch at which the proper individual electrodes 24 are arranged, and the dielectric factor of the piezoelectric sheets 21 used are common to all of them.

The following TABLE shows the results obtained by analyzing the respective piezoelectric actuators corresponding to Invention Examples 1, 2, 3 and Comparative Example, that is, respective electrostatic capacitances (pF) of the four piezoelectric actuators each as a whole, respective maximum displacement amounts (nm) of the four piezoelectric actuators, and respective changes ($\times 10^{-6}$ mm$^2$) of respective cross section areas of the respective ink chambers caused by the four piezoelectric actuators. The cross section areas of the ink chambers of the four piezoelectric actuators are those shown in FIGS. 7, 9, 10, and 11.

As shown in TABLE, each of the respective electrostatic capacitances of the three piezoelectric actuators corresponding to Invention Examples 1, 2, 3 is significantly smaller than that of the piezoelectric actuator corresponding to Comparative Example. Thus, it has been proved that if the thickness of at least one of the piezoelectric layers which are stacked on each other and each of which is sandwiched by the corresponding electrode layers is made greater than that of each of the other piezoelectric layer or layers, according to the present invention, the electrostatic capacitance of the piezoelectric actuator is significantly reduced.

TABLE

| | EXAMPLE 1 | EXAMPLE 2 | EXAMPLE 3 | COMPARATIVE EXAMPLE |
|---|---|---|---|---|
| THICKNESS OF PIEZOELECTRIC SHEET (μm) | 30 | 30 | 30 | 30 |
| NUMBER OF THICK LAYER(S) | 1 | 1 | 2 | 0 |
| THICKNESS OF THICK LAYER (μm) | 60 | 90 | 60 | 0 |
| ELECTROSTATIC CAPACITANCE OF ACTUATOR (pF) | 1100 | 1067 | 1000 | 1200 |
| MAXIMUM DISPLACEMENT AMOUNT OF ACTUATOR (nm) | 17.5 | 17.5 | 16.6 | 17.5 |
| CHANGE OF CROSS SECTION AREA OF INK CHAMBER ($\times 10^{-6}$ mm$^2$) | 2.34 | 2.33 | 2.20 | 2.33 |

Although each of the electrostatic capacitances of the two piezoelectric actuators corresponding to Invention Examples 1, 2 is significantly smaller than that of the piezoelectric actuator corresponding to Comparative Example, the maximum displacement amounts of the two piezoelectric actuators and the changes of cross section areas of the ink chambers caused by the two piezoelectric actuators are substantially the same as those of the piezoelectric actuator of Comparative Example. From this result, it has been confirmed that the electrostatic capacitances of the two piezoelectric actuators corresponding to Invention Examples 1, 2 can be decreased without decreasing the changes of cross section areas of the ink chambers caused by the two actuators.

In Invention Example 3, both the maximum displacement amount of the piezoelectric actuator corresponding thereto and the change of cross section area of the ink chamber caused by the actuator are smaller than those of the piezoelectric actuator of Comparative Example. However, the electrostatic capacitance, 1000 pF, of the piezoelectric actuator of Invention Example 3 is significantly smaller than that, 1200 pF, of the piezoelectric actuator of Comparative Example, that is, the former is smaller by about 17% than the latter, whereas the change, $2.20 \times 10^{-4}$ mm$^2$, of cross section area of the ink chamber caused by the actuator of Invention Example 3 are smaller than that, $2.33 \times 10^{-4}$ mm$^2$, of the actuator of Comparative Example, that is, the former is smaller by about 6% only than the latter. From this result, it has been confirmed that the electrostatic capacitance of the actuator of Invention Example 3 is efficiently decreased though the change of cross section area of the ink chamber caused by the actuator is more or less decreased as well.

In each of the illustrated embodiments, the piezoelectric actuator 20 is fixed to the cavity unit 10 as an object which utilizes the expansion and contraction of the active portions of the piezoelectric actuator 20, such that the thick piezoelectric layer 22 (i.e., the piezoelectric sheets 21g, 21h), 22a (21k), 22b (21g, 21l, 21m), 22c (21g, 21n), 22d (21o, 21p) is remoter from the object 10 than the thin or normal piezoelectric layer, i.e., each of the piezoelectric sheets 21b through 21f. According to this feature, the thick piezoelectric layer 22, 22a, 22b, 22c, 22d is remoter than the thin piezoelectric layer 21b through 21f from the object 10 which utilizes the deformation of the active portions of the piezoelectric actuator 20. Therefore, even if the amount of deformation of a portion of the thick layer 22, 22a, 22b, 22c, 22d that is located in each active portion may be considerably small, the utilization of deformation of each active portion by the object 10 is adversely influenced by the least amount only.

In each of the embodiments shown in FIGS. 7, 9, and 10, each piezoelectric layer 21b through 21f, 22, 22b, 22c, 22d comprises one piezoelectric sheet 21b through 21f, or two or more piezoelectric sheets 21g, 21h, 21l, 21m, 21n, 21o, 21p each of which is formed of a piezoelectric material. The thin piezoelectric layer 21b through 21f includes a first number of first piezoelectric sheet or sheets, and the thick piezoelectric layer 22, 22b, 22c, 22d includes a second number of second piezoelectric sheets 21g, 21h, 21l, 21m, 21n, 21o, 21p. The second number is greater than the first number. According to this mode, the piezoelectric actuator 20 can be produced in such a manner that the thickness of the thick piezoelectric layer 22, 22b, 22c, 22d can be easily changed by changing the total number of the piezoelectric sheets that are stacked on each other to provide the thick piezoelectric layer In the embodiment shown in FIG. 8, each piezoelectric layer 21b through 21f, 22a comprises a single piezoelectric sheet which is formed of a piezoelectric material. The thin piezoelectric layer 21b through 12f includes a single first piezoelectric sheet having a first thickness, and the thick piezoelectric layer 22a includes a single second piezoelectric sheet 21k having a second thickness greater than the first thickness. According to this feature, the piezoelectric actuator 22 can be produced in such a manner that the second thickness of the thick piezoelectric layer 22a can be easily selected at a desired value greater than the first thickness of the thin piezoelectric layer 21b through 21f.

In each of the illustrated embodiments, the piezoelectric actuator 20 comprises the plurality of active portions, and the actuator 20 is fixed to the cavity unit 10 having the plurality of ink chambers 16, such that the active portions are aligned with the ink chambers 16, respectively, so as to provide an ink jet printer head. The electrode layers 24, 25 of the actuator 20 include at least one individual-electrode layer including a plurality of individual electrodes 24 corresponding to the ink chambers 16, respectively, and at least one common electrode 25 which is common to the ink chambers 16. The individual electrodes 24 cooperate with the plurality of portions of the common electrode 25 to sandwich the plurality of portions of each of the piezoelectric layers 21b through 21h, 21l, 21m, 21n, 21o, 21p to provide the active portions, respectively, each of which is expanded and contracted to change a volume of a corresponding one of the ink chambers 16. According to this feature, the piezoelectric actuator 20 cooperates with the cavity unit 10 to provide the ink jet printer head in which the active portions of the piezoelectric actuator 20 face the ink chambers 16 of the cavity unit 10, respectively, and the actuator 20 can enjoy a decreased electrostatic capacity and can deform sufficiently largely each of the ink chambers 16.

It is to be understood that the present invention may be embodied with various changes and improvements that may occur to a person skilled in the art, without departing from the spirit and scope of the invention defined in the appended claims.

What is claimed is:

1. A piezoelectric actuator, comprising:
   a plurality of piezoelectric layers each of which is formed of a piezoelectric material, wherein the plurality of piezoelectric layers include at least one first piezoelectric layer, and at least one second piezoelectric layer;
   a plurality of electrode layers which are stacked alternately with the piezoelectric layers, wherein the plurality of electrode layers comprise at least three electrode layers including a first pair of electrode layers which cooperate with each other to sandwich said at least one first piezoelectric layer, and a second pair of electrode layers which cooperate with each other to sandwich said at least one second piezoelectric layer; and
   at least one active portion which is provided by respective portions of said at least one first piezoelectric layer and said at least one second piezoelectric layer, such that each of said respective portions is sandwiched by a corresponding pair of electrode layers of the first pair of electrode layers and the second pair of electrode layers, said corresponding pair of electrode layers being opposed to each other in a direction of the alternate stacking of the piezoelectric layers and the electrode layers, said at least one active portion being deformed when an electric voltage is applied to the plurality of electrode layers,
   wherein said at least one first piezoelectric layer has a first thickness equal to a distance between the two electrodes of the first pair, and said at least one second piezoelectric layer has a second thickness which is equal to a distance between the two electrodes of the second pair and is greater than the first thickness.

2. The piezoelectric actuator according to claim 1, wherein the piezoelectric actuator is fixed to an object which utilizes the deformation of said at least one active portion of the piezoelectric actuator, such that said at least one second piezoelectric layer is remoter from the object than said at least one first piezoelectric layer.

3. The piezoelectric actuator according to claim 1, wherein said at least one first piezoelectric layer comprises a first number of first piezoelectric sheet or sheets, and said at least one second piezoelectric layer comprises a second number of second piezoelectric sheets, the second number being greater than the first number.

4. The piezoelectric actuator according to claim 3, wherein the first piezoelectric sheet has a same thickness as a thickness of each of the second piezoelectric sheets.

5. The piezoelectric actuator according to claim 4, wherein the same thickness of each of the first and second piezoelectric sheets falls in a range of from 10 μm to 150 μm.

6. The piezoelectric actuator according to claim 1, wherein said at least one first piezoelectric layer comprises a single first piezoelectric sheet having the first thickness, and said at least one second piezoelectric layer comprises a single second piezoelectric sheet having the second thickness.

7. The piezoelectric actuator according to claim 6, wherein the second thickness is greater, by not less than 50%, than the first thickness.

8. The piezoelectric actuator according to claim 1, wherein the piezoelectric layers include a first number of said first piezoelectric layers, and a second number of said second piezoelectric layer or layers, the second number being not greater than half a sum of the first number and the second number.

9. The piezoelectric actuator according to claim 1, comprising a plurality of said active portions, wherein the actuator is fixed to a cavity unit having a plurality of ink chambers, such that the active portions are aligned with the ink chambers, respectively, so as to provide an ink jet printer head, and wherein one of said corresponding pair of electrode layers of the actuator is an individual-electrode layer including a plurality of individual electrodes corresponding to the ink chambers, respectively, and the other of said corresponding pair of electrode layers of the actuator is a common electrode which is common to the ink chambers, the individual electrodes cooperating with the common electrode to sandwich a plurality of portions of each of the piezoelectric layers to provide the active portions, respectively, each of which is deformed to change a volume of a corresponding one of the ink chambers.

10. The piezoelectric actuator according to claim 1, wherein the plurality of piezoelectric layers include a plurality of said first piezoelectric layers and said at least one second piezoelectric layer.

11. The piezoelectric actuator according to claim 1, further comprising at least one restrictive layer fixed to the alternately stacked piezoelectric layers and electrode layers, said at least one restrictive layer restricting the deformation of said at least one active portion in the piezoelectric layers.

12. An ink jet printer head, comprising:
   a cavity unit having a plurality of ink chambers each of which accommodates an ink, and additionally having a plurality of nozzles which communicate with the ink chambers, respectively, and eject a droplet of the ink toward a recording medium; and
   a piezoelectric actuator which is fixed to the cavity unit, the piezoelectric actuator including
   a plurality of piezoelectric layers each of which is formed of a piezoelectric material and which include at least one first piezoelectric layer at least one second piezoelectric layer;
   a plurality of electrode layers which are stacked alternately with the piezoelectric layers, wherein the plurality of electrode layers comprise at least three electrode layers including a first pair of electrode layers which cooperate with each other to sandwich said at least one first piezoelectric layers, and a second pair of electrode layers which cooperate with each other to sandwich said at least one second piezoelectric layer; and a plurality of active portions which are aligned with the ink chambers of the cavity unit, respectively, and each of which is provided by respective portions of said at lest one first niezoelectric layer and said at least one second piezoelectric layer, such that each of said respective portions is sandwiched by a corresponding pair of electrode layers of the first pair of electrode layers and the second pair of electrode layers, said corresponding pair of electrode layers being opposed to each other in a direction of the alternate stacking of the piezoelectric layers and the electrode layers, said each active portion being deformed to change a volume of a corresponding one of the ink chambers, when an electric voltage is applied to the plurality of electrode layers, wherein said at least one first piezoelectric layer has a first thickness equal to a distance between the two electrodes of the first pair, and said at least one second piezoelectric layer has a second thickness which is equal to a distance between the two electrodes of the second pair and is greater than the first thickness.

13. The ink jet printer head according to claim 12, wherein said at least one second piezoelectric layer is remoter from the cavity unit than said at least one first piezoelectric layer.

14. The ink jet printer head according to claim 12, wherein one of said corresponding pair of electrode layers of the piezoelectric actuator is an individual-electrode layer including a plurality of individual electrodes corresponding to the ink chambers of the cavity unit, respectively, and the other of said corresponding pair of electrode layers is a common electrode which is common to the ink chambers, the individual electrodes cooperating with the common electrode to sandwich a plurality of portions of each of the piezoelectric layers to provide the active portions, respectively.

15. The ink jet printer head according to claim 12, wherein the plurality of piezoelectric layers of the piezoelectric actuator include a plurality of said first piezoelectric layers and said at least one second piezoelectric layer.

* * * * *